United States Patent
Onodera et al.

(10) Patent No.: US 7,052,574 B2
(45) Date of Patent: May 30, 2006

(54) METHOD FOR PRODUCING METAL LAMINATE

(75) Inventors: Minoru Onodera, Kurashiki (JP); Tatyuya Sunamoto, Kurashiki (JP); Tadao Yoshikawa, Kurashiki (JP)

(73) Assignee: Kuraray Co., Ltd., Kurashiki (JP)

(*) Notice: Subject to any disclaimer, the term of this patent is extended or adjusted under 35 U.S.C. 154(b) by 377 days.

(21) Appl. No.: 10/090,747

(22) Filed: Mar. 6, 2002

(65) Prior Publication Data

US 2002/0170939 A1 Nov. 21, 2002

(30) Foreign Application Priority Data

Mar. 7, 2001 (JP) .............................. 2001-063382

(51) Int. Cl.
*B32B 31/20* (2006.01)
(52) U.S. Cl. .................... 156/309.6; 156/324; 264/345
(58) Field of Classification Search ................ 156/209, 156/219, 221, 223, 308.2, 309.6, 309.9, 324; 264/345, 346
See application file for complete search history.

(56) References Cited

U.S. PATENT DOCUMENTS

| | | | | |
|---|---|---|---|---|
| 3,947,296 A | * | 3/1976 | Kumazawa | ............... 148/111 |
| 4,798,875 A | * | 1/1989 | Itoyama et al. | ............. 525/444 |
| 4,880,589 A | * | 11/1989 | Shigemoto et al. | ......... 264/216 |
| 5,028,457 A | * | 7/1991 | Kinose et al. | ............... 427/258 |
| 5,360,672 A | * | 11/1994 | Saito et al. | ................. 428/480 |
| 5,529,740 A | | 6/1996 | Jester et al. | |
| 5,703,202 A | | 12/1997 | Jester et al. | |
| 5,719,354 A | | 2/1998 | Jester et al. | |
| 5,843,562 A | | 12/1998 | Onodera et al. | |
| 6,159,412 A | * | 12/2000 | Fletcher et al. | ............. 264/444 |
| 6,274,242 B1 | | 8/2001 | Onodera et al. | |
| 6,334,922 B1 | | 1/2002 | Tanaka et al. | |
| 6,616,796 B1 | | 9/2003 | Onodera et al. | |

FOREIGN PATENT DOCUMENTS

| | | |
|---|---|---|
| EP | 0 311 232 | 4/1989 |
| EP | 0 507 332 A2 | 3/1992 |
| EP | 0 689 927 | 1/1996 |
| EP | 0 734 851 | 10/1996 |
| JP | 2000-273225 | 3/2000 |

OTHER PUBLICATIONS

U.S. Appl. No. 09/534,997 filed Mar. 27, 2000, Onodera et al.
U.S. Appl. No. 10/947,160, filed Sep. 23, 2004, Onodera et al.

* cited by examiner

*Primary Examiner*—Jeff H. Aftergut
*Assistant Examiner*—John L. Goff
(74) *Attorney, Agent, or Firm*—Oblon, Spivak, McClelland, Maier & Neustadt, P.C.

(57) ABSTRACT

To continuously produce a metal laminate having excellent dimensional stability and flatness, there is provided with a method of producing a metal laminate in which a thermoplastic liquid crystal polymer film (5') capable of forming an optically anisotropic melt phase is heat-treated on a heat treatment roll having unevenness (91) on its surface and subsequently a metal sheet (3) is bonded to at least one side of the film (5').

4 Claims, 1 Drawing Sheet

METHOD FOR PRODUCING METAL LAMINATE

BACKGROUND OF THE INVENTION

1. Field of the Invention

The present invention relates to a method for producing a metal laminate having a film (which film is hereinafter referred to as a thermoplastic liquid crystal polymer film) made of a thermoplastic polymer capable of forming an optically anisotropic melt phase (which thermoplastic polymer is hereinafter referred to as a thermoplastic liquid crystal polymer). The metal laminate obtained by the method of this invention has excellent properties such as low moisture absorbability, heat resistance, chemical resistance and electrical properties deriving from the thermoplastic liquid crystal polymer film and also has excellent thermal dimensional stability. Therefore, it is useful as a material for a circuit board or a base material which requires thermal dimensional stability.

2. Description of the Related Art

In recent years, the demands for scale reduction and weight reduction in portable electronic devices for mobile communication and others are becoming high, and an expectation for high density mounting is becoming increasingly strong. In accordance therewith, multi-layered wiring boards, reduced wiring pitches, fine via holes, and small-size multiple-pin IC packages are being developed, and also the scale reduction and surface mounting of passive elements such as capacitors and resistors are taking place along with this. Particularly, the technique of making these passive components directly mounted on a surface or built in an inside of a printed wiring board or the like can achieve high density mounting and an improvement in reliability. As a result, the dimension accuracy of the wiring boards or accuracy of wiring pitches, is highly required, and further there is a demand for thermal dimensional stability.

The thermoplastic liquid crystal polymer film having excellent properties such as low moisture absorbability, heat resistance, chemical resistance and electrical properties is under rapid development as electrical insulation materials which improves reliability of printed wiring boards and the like.

Conventionally, in producing a metal laminate for a circuit board such as a printed wiring board, a thermoplastic liquid crystal polymer film, cut to a predetermined size, and a metal foil are placed in superposition between two hot platens with the use of a vacuum hot press device, and thermally press-bonded in a vacuum state (batch type vacuum hot press lamination). At this time, if molecular orientation ratio of the thermoplastic liquid crystal polymer film before press-bonding has a value of approximately 1 with an aspect ratio of mechanical strength, a metal laminate having satisfactory dimension stability can be obtained. However, since the vacuum hot press lamination is a sheet-type production method, the period of time for superposing the materials, the period of time for one pressing operation, the period of time for taking out the materials after pressing, and the like will be long. So, the production speed per one sheet of the metal laminate may be slow and the production cost may be increased. Moreover, if the equipments are improved so that a large number of sheets can be produced at the same time in order to improve the production speed, then the equipments will be large in scale, disadvantageously leading to high equipment cost. Accordingly, there is a demand for solving this problem and developing a continuous production method capable of providing metal laminates at a low production cost.

EP 0507332 A2 discloses a process for producing laminates, which comprises placing in layers at least one film comprising a liquid crystal polymer capable of forming an optically anisotropic melt phase and at least one metal foil and pressing the resulting layers by passing them through a nip between press rolls at a temperature in the range from 80° C. below the melting point of said liquid crystal polymer to 5° C. below the said melting point.

EP 0507332 A2 discloses conditions for improving a bond strength between a thermoplastic liquid crystal polymer film and a metal foil, and improvement of the mechanical strength of layer of the thermoplastic liquid crystal polymer film in the resultant metal laminate are taken into consideration. However, EP 0507332 A2 is silent with the dimension stability of the resultant metal laminate. In other words, in the method of EP 0507332 A2, the temperature condition at the time of the thermal press-bonding of the thermoplastic liquid crystal polymer film and metal foil between the press rolls is taught, but residual strain of the film before thermal press-bonding is not considered. When thermoplastic liquid crystal polymer film having the residual strain is thermally press-bonded to the metal foil, a form of the film becomes poor, and thus the resultant metal laminate does not have enough dimensional stability and flatness. For this reason, it is difficult to continuously and stably obtain flat metal laminates with excellent dimensional stability by the method of EP 0507332 A2.

SUMMARY OF THE INVENTION

In view of the foregoing, the inventors of the present invention have made studies on the method that can stably and continuously produce metal laminates having excellent dimensional stability and flatness, and have found out the followings.

When a thermoplastic polymer film, the residual strain of which has been eliminated effectively, is laminated with a metal sheet such as a metal foil or metal plate between press rolls, a metal laminate having excellent dimensional stability and flatness can be obtained.

When the thermoplastic liquid crystal polymer film is heated in a freely stretchable state, the film shrinks in an oriented direction and expands in a non-oriented direction, and further the direction of orientation easily changes by the force working on the film. Particularly in the cooling process, the molecules, which are not oriented, are effected by the movement of the oriented molecules so as to tend to orient in the same direction of the oriented molecules. For this reason, the film has a property to shrink in a direction vertical to the oriented direction.

Even if the thermoplastic liquid crystal polymer film is stretched at the time of melt film forming so that its mechanical properties become isotropic, residual strain still remains. The residual strain does not always coincide with an orientation of the molecules. As a method of eliminating the residual strain, a method of conventional heat-treatment of the film was considered. But in the case where the method adopts a float type represented by a conventional continuous heat-treatment equipment, a tension is applied to the film. This does not sufficiently eliminate the residual strain and also causes thermal strain on the film by the tension.

However, according to the founding of the inventors of the present invention, if the film is heat-treated on a heat treatment roll having unevenness or irregularities on its surface, a tension applied to the film by the film drawing is relieved by a frictional force exerted by the unevenness, the heat treatment can be carried out in a state without shrink and expansion so that the residual strain of the film can be eliminated effectively. When the film thus obtained and the metal sheet are bonded, a metal laminate having excellent dimensional stability and flatness can be obtained stably and continuously, because shrink and extension does not occur in the film.

According to the above foundings, the present inventors have succeeded in providing a method capable of obtaining a metal laminate having excellent dimensional stability and flatness stably and continuously using a heat treatment roll having unevenness on its surface.

The present invention is intended to provide an improved method of producing metal laminate characterized in that a metal sheet is bonded to at least one side of the thermoplastic liquid crystal polymer film which has been heat-treated on a heat treatment roll having unevenness on its surface.

U.S. Pat. No. 5,843,562 or Japanese Patent Application Laid-Open No. 2000-273225 discloses a method which improves properties of a thermoplastic liquid crystal polymer film using a roll having unevenness on its surface.

U.S. Pat. No. 5,843,562 discloses a technique which allows a thermoplastic liquid crystal film to pass between at least one pair of press rolls, of which at least one roll has specified unevenness on its surface, and embosses the film to transfer unevenness onto the film and thus improve abrasion resistance. Also, Japanese Patent Application Laid-Open No. 2000-273225 discloses a technique which allows a thermoplastic liquid crystal polymer film to heat-shrink under no stress so as to improve its characteristics and prevents peeling inside of the film (inner layer peeling). This document describes that in the case where waving or deflection occurs on the film due to the heat shrink, the film is brought into contact with an embossed roll (260° C.) so that the film can be flattened easily.

However, both U.S. Pat. No. 5,843,562 and Japanese Patent Application Laid-Open No. 2000-273225 refer to the technique for adjusting a form of the film and do not disclose or suggest that residual strain of the thermoplastic liquid crystal polymer film can be eliminated effectively by the heat treatment using the heat treatment roll having unevenness on its surface, and that a metal laminate is continuously produced by using the film in which the residual strain has been eliminated effectively.

In the method of the present invention, the metal sheet is preferable to be thermally press-bonded to at least one side of the thermoplastic liquid crystal polymer film continuously. Also, a height of the unevenness provided on the surface of the heat treatment roll is preferably 1 to 15 μm in order to effectively eliminate the residual strain of the film. Further, a temperature of the heat treatment roll is preferably within the range from a temperature lower by 30° C. than a thermal deflection temperature of the film to the thermal deflection temperature. A thermal dimensional change at 200° C. of the thermoplastic liquid crystal polymer film processed by the heat treatment roll is preferably not more than 0.1% in order to obtain a metal laminate having excellent dimension stability.

BRIEF DESCRIPTION OF THE DRAWING

In any event the present invention will become more clearly understood from the following description of preferred embodiments thereof, when taken in conjunction with the accompanying drawing. However, the embodiment and the drawing are given only for the purpose of illustration and explanation, and are not to be taken as limiting the scope the present invention in any way whatsoever which scope is to be determined by the appended claims.

DETAILED DESCRIPTION OF PREFERRED EMBODIMENTS

Figure 1:
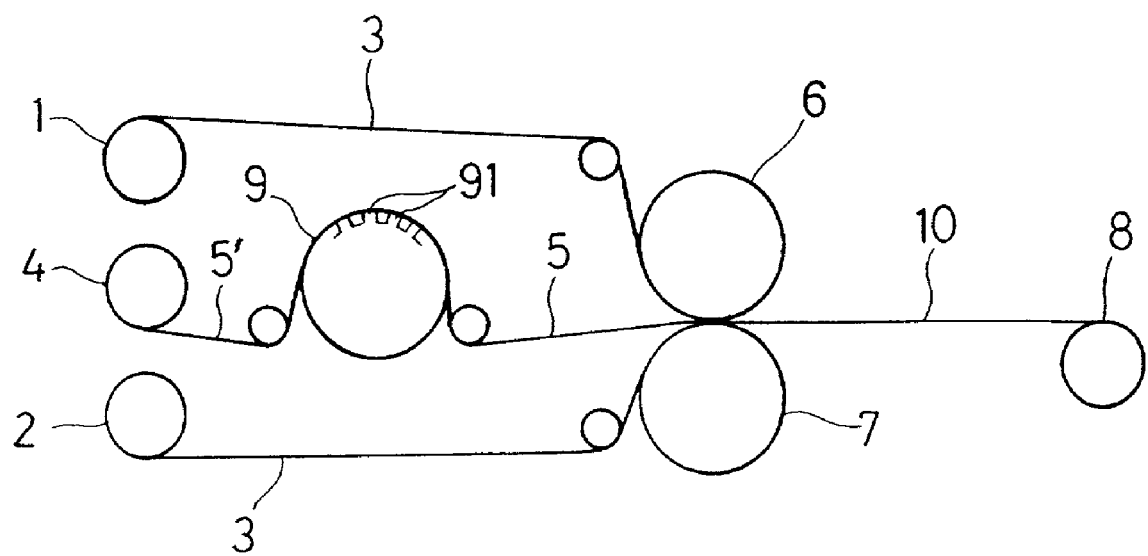
FIG. 1 is a schematic diagram showing a device to be used for a method for producing a double-sided metal laminate according to one embodiment of the present invention.

There will be explained below one embodiment of the present invention with reference to the drawings.

FIG. 1 shows a continuous hot roll press apparatus according to one embodiment to be used for a method of producing a double-sided metal laminate. With this apparatus, a long thermoplastic liquid crystal polymer film 5, which is unwound from a third unwinding roll 4, is nipped between two long metal sheets 3 and 3, which are unwound from first and second unwinding rolls 1 and 2 (upper and lower), and they are supplied to between a pair of press rolls 6 and 7 (upper and lower) to be press-bonded. As a result, a double-sided metal laminate 10, in which the metal sheets 3 and 3 are integrally bonded to both the sides of the thermoplastic liquid crystal polymer film 5, is continuously formed. This metal laminate 10 is drawn by a winding roll 8.

Further, a heat treatment roll 9 such as an embossed roll on which a lot of unevenness 91 are formed is disposed between the third unwinding roll 4 and a pair of the press rolls 6 and 7. The heat treatment roll 9 gives a heat treatment to a thermoplastic liquid crystal polymer film 5' so that residual strain of the film 5' is eliminated. In other words, when the heat treatment roll 9 gives the heat treatment to the thermoplastic liquid crystal polymer film 5', a tension of the film 5' is relieved by a frictional force exerted by the unevenness 91 formed on the heat treatment roll 9 when the film 5' is drawn by the winding roll 8. The film 5' is heat-treated in a state that the film does not shrink or expand so that the residual strain of the film 5' is eliminated effectively. After the heat treatment, the metal sheets 3 and 3 are thermally press-bonded to the thermoplastic liquid crystal polymer film 5 by the press rolls 6 and 7. Because the residual strain of the film 5 has been already eliminated, the film 5 does not shrink or expand. As a result, the metal laminate 10 which has satisfactory dimensional stability and flatness can be stably and continuously obtained.

The thermoplastic liquid crystal polymer to be used in the present invention is not particularly limited. However, its concrete examples are well-known thermotropic liquid crystal polyester and thermotropic liquid crystal polyester amide which are prepared from compounds which are classified into the following exemplified compounds and from their derivatives.

(1) Aromatic or aliphatic dihydroxy compound (as for typical example, see Table 1)

TABLE 1

Chemical formula of typical example of aromatic or aliphatic dihydroxy compound

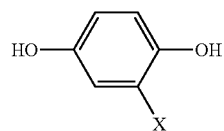
(X is hydrogen or halogen, or a group of lower alkyl or phenyl)

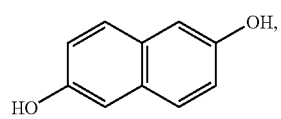

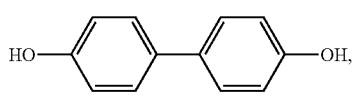

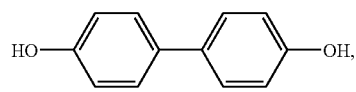
(Y is a group of —O—, —CH$_2$— or —S—)

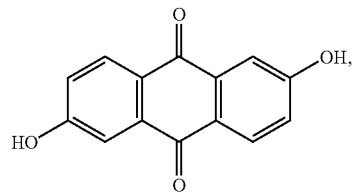

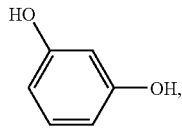

HO(CH$_2$)$_n$OH   (n is an integer of 2 to 12)

(2) Aromatic or aliphatic dicarboxylic acid (as for typical example, see Table 2)

TABLE 2

Chemical formula of typical example of aromatic or aliphatic dicaroboxylic acid

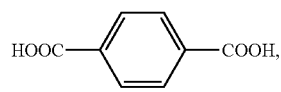

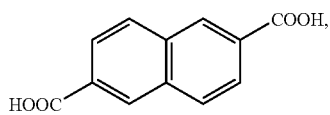

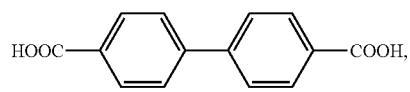

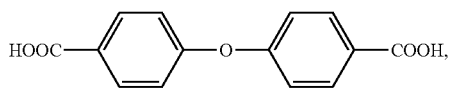

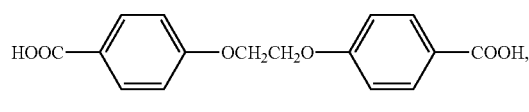

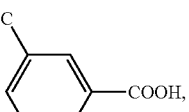

HOOC(CH$_2$)$_n$COOH   (n is an integer of 2 to 12)

(3) Aromatic hydroxycarboxylic acid (as for typical example, see Table 3)

TABLE 3

Chemical formula of typical example of aromatic hydroxycarboxylic acid

HO—⟨phenyl with X⟩—COOH   (X is hydrogen or halogen, or a group of lower alkyl or phenyl)

⟨naphthalene⟩ HO—, —COOH

HO—⟨biphenyl⟩—COOH,

HO—⟨phenyl⟩—COOH (4) Aromatic diamine, aromatic hydroxyamine or aromatic aminocarboxylic acid (as for typical example, see Table 4)

TABLE 4

Chemical formula of typical example of aromatic diamine, aromatic hydroxyamine or aromatic aminocarboxylic acid $H_2N$—⟨phenyl⟩—$NH_2$,  $H_2N$—⟨phenyl⟩—OH,  $H_2N$—⟨phenyl⟩—COOH Typical examples of the thermoplastic liquid crystal polymer obtained from these compounds are copolymers (a) to (e) having structural units shown in Table 5.

TABLE 5

Typical example of thermoplastic liquid crystal polymer (a) —[OC—⟨phenyl⟩—CO]—  —[OCH₂CH₂O]—  —[OC—⟨phenyl⟩—O]—   Copolymer (b) —[O—⟨phenyl⟩—CO]—  —[O—⟨naphthalene⟩—CO]—   Copolymer (c) —[O—⟨phenyl⟩—CO]—  —[OC—⟨phenyl⟩—CO]—  —[OC—⟨phenyl⟩—CO]—   Copolymer

TABLE 5-continued

Typical example of thermoplastic liquid crystal polymer (d) Copolymer (e) Copolymer (Y is a group of —O—, —CH$_2$— or —S—)

In addition, the thermoplastic liquid crystal polymer to be used in the present invention preferably has a melting point within the range of from about 200 to about 400° C., more preferably within the range of from about 250 to about 350° C. in order to give desirable heat resistance and workability to a film. From the viewpoint of the production of a film, the polymer having a comparatively low melting point is preferable. Therefore, in the case where higher heat resistance and higher melting point are required, an obtained film is heat-treated so as to have desirable heat resistance and melting point. As one example of the heat treatment, the obtained film, having the melting point of 283° C., is heated at 260° C. for 5 hours so that its melting point goes up to 320° C.

The thermoplastic liquid crystal polymer film is obtained by extrusion-molding of a thermoplastic liquid crystal polymer. At this time any known extrusion molding method may be adopted. Among them, T-die film forming and stretching method, lamination and stretching method, inflation method and the like are industrially advantageous. Particularly with the lamination and stretching method or inflation method, stresses can be applied not only in a direction of the mechanical axis of the film (which direction is hereinafter referred to as "MD direction" or "MD") but also in a direction perpendicular to the MD direction (which direction is hereinafter referred to as "TD direction" or "TD"). This makes it possible to obtain a film in which mechanical properties and thermal characteristics are well balanced in the MD direction and the TD direction.

The thickness of the thermoplastic liquid crystal polymer film is not particularly limited. A plate-like or sheet-like film of not more than 2 mm can be also used. However, in the case where the thermoplastic liquid crystal polymer film is used for a printed wiring board, the thickness of the film is preferably within the range of from 20 to 150 μm, more preferably within the range of from 20 to 50 μm. If the thickness of the film is smaller than 20 μm, rigidity and strength of the film become small. As a result, the film may be deflected in mounting electronic components on the obtained printed wiring board, and this makes bad influences on position accuracy of wiring. Further, the thermoplastic liquid crystal polymer film can contain additives such as a lubricant or an antioxidant.

Furthermore, it is preferable that a coefficient of thermal expansion of the thermoplastic liquid crystal polymer film is substantially equal with a coefficient of thermal expansion of an electrical conductor, which includes metal sheet, formed on this film. The coefficient of thermal expansion of the thermoplastic liquid crystal polymer film may be adjusted before and/or after the electric conductor is formed on the thermoplastic liquid crystal polymer film. Also, the coefficient of thermal expansion of the thermoplastic liquid crystal polymer film may be adjusted before and/or after the heat treatment by means of the heat treatment roll having unevenness on its surface. The coefficient of thermal expansion of the thermoplastic liquid crystal polymer film can be adjusted by conventional heat treatment. Well known means such as a dry oven, a ceramic heater, hot press and the like can be used for this purpose.

In the present invention, before the metal sheet 3 are thermally press-bonded to the thermoplastic liquid crystal polymer film 5, the thermoplastic liquid crystal polymer film 5' is heat-treated by the heat treatment roll 9 on which the unevenness 91 are formed so that the residual strain of the film 5' is eliminated. A pattern of the unevenness 91 on the heat treatment roll 9 is not particularly limited. An embossed roll can be used as the heat treatment roll 9. Also, a roll having specified projections in a particular pattern can be used as the heat treatment roll 9.

A height of the unevenness 91 of the heat treatment roll 9 is preferably 1 μm to 15 μm. In the case where the height of the unevenness 91 is less than 1 μm, a frictional force exerted by the heat treatment roll 9 becomes low, and the residual strain tends not to be eliminated. On the other hand, in the case where the height exceeds 15 μm, the unevenness 91 are transferred onto the film 5', and the film 5 tends to easily trap air at the later step of bonding with the metal sheet 3. A height of the unevenness 91 is more preferably 3 μm to 15 μm. Also, when a thickness of the thermoplastic liquid crystal polymer film is H (μm), the height of the unevenness does not desirably exceed 2H/3. The heat treatment roll 9 has a density of unevenness 91 of preferably 3 to 600, more preferably 5 to 120, further preferably 5 to 60 unevenness per 10000 μm² of its surface area.

In addition, a temperature of the heat treatment roll 9 is preferably within the range from a temperature lower by 30° C. than a thermal deflection temperature of the thermoplastic liquid crystal polymer film 5' to the thermal deflection temperature. At the temperature which is out of this range, the residual strain may not be sufficiently eliminated.

The heat treatment time by the heat treatment roll 9 is preferably 1 second to 20 seconds. 2 seconds to 15 seconds is more preferable as heat treatment time which does not depend on the temperature change around the roll and the thickness change of the film 5'. 2 seconds to 10 seconds is particularly preferable.

Also, a thermal dimensional change of the thermoplastic liquid crystal polymer film 5 processed by the heat treatment roll 9 at 200° C. is preferably not more than 0.1% in order to produce a metal laminate 10 having a high dimensional stability. When the rate is larger than 0.1%, the dimensional stability of the laminate 10 may be reduced.

The heat treatment by the heat treatment roll 9 having unevenness is preferably carried out in a substantially unpressurized state. However, the film 5' is not prevented from being stressed at the time of contact with the heat treatment roll 9 according to traveling of the film.

In the present invention, the long metal sheets 3,3 are laminated respectively on both sides of the long thermoplastic liquid crystal polymer film 5, and they are passed between a pair of press rolls 6 and 7 so as to be thermally press-bonded to give the double-sided metal laminate 10 in which the metal sheets 3,3 have been integrally bonded onto the both sides of the thermoplastic liquid crystal polymer film 5 continuously. In the case where the double-sided metal laminate 10 is obtained in such a manner, heating metal rolls are used as the press rolls 6 and 7. Also, a single-sided metal laminate can be obtained in the present invention. In this case, a heat-resistant rubber covered roll and a heating metal roll are combined to be used as the press rolls 6 and 7. The heat-resistant rubber covered roll and the heating metal rolls are preferably positioned in such a manner that the heat-resistant rubber covered roll is positioned at the film side, and the heating metal roll is positioned at the metal sheet side. The heat-resistant rubber covered roll preferably have a hardness (Hardness of JIS A) of the roll surface of 80 degrees or more, more preferably within the range of from 80 to 95 degrees, as tested by an A-type spring hardness tester based on JIS K 6301. The rubber having a hardness (hardness of JIS A) of 80 degrees or more can be obtained by adding a vulcanizer and a vulcanization accelerator such as an alkaline substance into a synthetic rubber such as a silicone rubber and a fluororubber, or into natural rubber. If the hardness of the roll surface of the heat-resistant rubber covered roll is smaller than 80 degrees, the pressure at the time of thermal press-bonding is so insufficient that the adhesion between the film 5 and metal sheet 3 tends to be reduced. On the other hand, if the hardness of the roll surface of the heat-resistant rubber covered roll exceeds 95 degrees, a local high pressure applied between the heating metal roll and the heat-resistant rubber covered roll may cause a poor appearance on the laminate 10.

Further, the thermoplastic liquid crystal polymer film 5 and the metal sheets 3 are thermally press-bonded between the press rolls 6 and 7, one of which is a roll having a rubber coating layer, in a planar state, by deflecting the coating layer by a force applied to the coating layer and the other press roll. In such a case, the pressure is applied to the film 5 and the metal sheets 3 is preferably not less than 20 Kg/cm² expressed in an areal pressure. When the areal pressure is not less than 20 Kg/cm², an uniform laminate 10 having sufficient bond strength can be obtained.

In the case where rolls in which their pressing portions do not substantially subject to deflection are employed in a pair, the pressure, which applied to the thermoplastic liquid crystal polymer film 5 and metal sheets 3 on press-bonding, is preferably not less than 5 Kg/cm expressed in a linear pressure in order to provide sufficient bond strength. The upper limit of the pressure is not particularly limited. The upper limit does not desirably exceed 400 Kg/cm expressed in the linear pressure at which the bond strength of the laminate 10 becomes sufficient or does not exceed 200 Kg/cm² expressed in the areal pressure at which the flow of the film or protrusion of the film from the metal sheet can be prevented.

The linear pressure of the press roll is a value obtained by dividing a force to be applied to the heating roll (press-bonding load) by an effective width of the heating roll. Also, the surface pressure is a value obtained by dividing the press-bonding load by an area of the pressing surface on the heating roll formed by deflection thereof at the time of press-bonding.

In the present invention, in order to realize the good appearance, the high bond strength of the laminate and the high dimension stability, the thermoplastic liquid crystal polymer film and the metal sheet are preferable to be thermally press-bonded at a temperate in the range of from a temperature lower by 50° C. than the melting point of the thermoplastic liquid crystal polymer film to a temperature lower by 5° C. than the melting point. In addition preheating a metal sheet can relieve its rapid thermal expansion and strain at the time of contact with the press roll to give a metal laminate having good appearance, even if the tension worked on the thermoplastic film is increased. It is preferred to set the pre-heating temperature variously depending on a material, a coefficient of thermal expansion and a thickness of the metal sheet. For example, when a copper foil having a thickness of 18 μm and a width of 400 mm produced by an electrolysis method is used, the temperature is preferably about 150 to 200° C. An atmosphere at the time of pre-heating may be selected depending on a material of the metal sheet. In the case of material to be easily oxidized by oxygen in air, an inert atmosphere of nitrogen or the like is preferable.

In the present invention, a rotating speed of the press roll is, when expressed in a linear speed of its outer periphery, preferably not more than 30 m/min. In order to make heat transmission of the metal sheet effective at the time of the contact with press roll, the speed is preferably not more than 20 m/min. A lower limit of rotating speed is not particularly limited, but a too low rotating speed causes low productivity. The rotating speed is desirably set to a value not lower than 0.1 m/min.

The metal sheet is not particularly limited. However, a foil made of a metal used for electrical connection is suitable. A foil made of copper, gold, silver, nickel or aluminum can be used. As the copper foil, any copper foils which are produced by the rolling method, the electrolysis method or the like can be used. Among them, an electrolytic copper foil having large surface roughness is preferable because the bond strength of the copper foil with the thermoplastic liquid crystal polymer film is high. A metal foil may be subject to a surface treatment such as etching which is normally given.

A thickness of the metal foil is preferably 5 to 200 μm, and more preferably 5 to 75 μm. In the present invention, instead of the metal foil, a metal plate having a thickness of 0.2 to 2 mm can be used as the metal sheet. Particularly in the case where the laminate produced by the process of the present invention is used as a heat radiation plate for electronic parts, the thickness of the metal plate is preferably 0.2 to 1 mm in view of bending workability. Since the metal plate having such a thickness is generally produced by the rolling method and its surface roughness is not more than 1 µm, it is recommendable to give a surface roughness of preferably 2 to 4 µm by chemical or physical treatment on the metal plate. This makes the bond strength between the metal plate and the thermoplastic liquid crystal polymer film high. Also, the surface roughness is not particularly limited. However, the surface roughness of the metal plate is preferably less than 50% of the thickness of the metal plate, from the viewpoint of the strength of the metal plate. Also, the surface roughness is preferably less than 50% of the thickness of the thermoplastic liquid crystal polymer film, from the viewpoint of the strength of the thermoplastic liquid crystal polymer film of the metal laminate.

EXAMPLES

Hereinafter, the present invention will be concretely described with reference to the Examples. However, the present invention is in no way limited by these Examples. Here, in the following Reference Examples and Examples, melting point, thermal deflection temperature, thickness, mechanical properties (tensile strength or elasticity) and appearance of the thermoplastic liquid crystal polymer film, bond strength and dimensional stability of the laminate, and thermal dimensional change of the film were evaluated in the following manners.

(1) Melting Point

Using a differential scanning calorimeter, the thermal behavior of the film was observed to determine the melting point. In other words, after the temperature of the test film was raised at a rate of 20° C./min to completely melt the film, the molten product was rapidly cooled to 50° C. at a rate of 50° C./min and then the position of the heat absorption peek appearing when the temperature thereof was raised again at a rate of 20° C./min was recorded as the melting point of the film.

(2) Thermal Deflection Temperature

Using a thermomechanical analyzer (TMA), a temperature at which rapid extension of the film was observed, under the condition that a tensile load of 1 g was applied to one side of the film and the temperature of the film is raised from room temperature to 200° C. at a rate of 5° C./min, was regarded as the thermal deflection temperature.

(3) Thickness

The thickness of the obtained film was measured by a digital thickness meter (produced by Mitsutoyo Corporation) at intervals of 1 cm in the TD direction, and average value of ten points was as the thickness.

(4) Mechanical Properties (Tensile Strength or Elasticity)

The tensile strength or elasticity of a test piece, cut from the obtained film, was measured by using a tensile tester according to the method ASTM D 882.

(5) Appearance

The appearance was observed visually. An appearance of a film having a length of not less than 200 m where wrinkle, rib and deflection were not observed was evaluated as ○ (best), an appearance of a film where less than one wrinkle, rib and deflection was observed per length of 1 m was evaluated as Δ (satisfactory), and an appearance of a film where not less than one wrinkle, rib, deflection or non-bonded portion were observed per length of 1 m was evaluated as × (no good).

(6) Bond Strength of Laminate

A test piece having a width of 1.0 cm was made from a laminate and the film layer thereof was fixed to a flat plate by a double-sided bonding tape. Then, a metal sheet of the test piece was peeled at a rate of 50 mm/min by the 180° method according to JIS C 5016. The peel strength at this time was measured.

(7) Dimensional Stability of Laminate

The dimensional stability was measured according to JIS C 6471.

(8) Thermal Dimensional Change of Film

A film was heated with a dry oven left for 30 minutes at 200° C. and taken out from the oven. A thermal dimensional change (%) between a length of the film after taking-out and a length before the heating process was measured at nine points, which are three points in the lengthwise direction and three points in the widthwise direction, according to IPC-TM-650.2.2.4. Its average value was used as the thermal dimensional change.

REFERENCE EXAMPLE 1

A thermoplastic liquid crystal polymer, which is a copolymer of p-hydroxybenzoic acid and 6-hydroxy-2-naphthoic acid and having a melting point of 280° C., was melt-extruded at an output rate of 20 Kg/hour to give a film by the inflation molding method under conditions that lateral expansion rate was 4.00 times and vertical expansion rate was 2.50 times. As a result, the thermoplastic liquid crystal polymer film having average thickness of 50 µm, thickness distribution of ±7% and MD to TD ratio of tensile strength of 1.05 was obtained. The thermal dimensional change at 200° C. of the film was +0.1% in the MD direction and −0.5% in the TD direction. Also, the thermal deflection temperature was 200° C. This thermoplastic liquid crystal polymer film is referred to as A-type.

REFERENCE EXAMPLE 2

A thermoplastic liquid crystal polymer, which is a copolymer of p-hydroxybenzoic acid and 6-hydroxy-2-naphthoic acid and having a melting point of 280° C., was melt-extruded at an output rate of 20 Kg/hour to give a film by the inflation molding method under conditions that lateral expansion rate was 2.00 times and vertical expansion rate was 5.00 times. As a result, the thermoplastic liquid crystal polymer film having average thickness of 50 µm, thickness distribution of ±7% and MD to TD ratio of tensile strength of 3.5 was obtained. The thermal dimensional change at 200° C. of the film was +0.8% in the MD direction and −2.0% in the TD direction. Also the thermal deflection temperature was 200° C. This thermoplastic liquid crystal polymer film is referred to as B-type.

EXAMPLE 1

The thermoplastic liquid crystal polymer film of A-type obtained in the Reference Example 1 and electrolytic copper foils having a thickness of 18 µm were used. A roll having a lot of unevenness 91 with a height of 15 µm at a rate of 10 per 10000 μm² on its surface was attached as the heat treatment roll 9 to the continuous hot roll press apparatus shown in FIG. 1. A temperature of the heat treatment roll 9 was set to 200° C. and a temperature of the press rolls 6 and 7 was set to 260° C. The film of A-type and the electrolytic copper foils were thermally press-bonded by these rolls at a pressure of 10 Kg/cm², while being drawn at a rate of 2 m/min, to give a double-sided metal laminate 10 having a structure of metal foil/thermoplastic liquid crystal polymer film/metal foil structure. A tension of 3 Kg/40 cm width was applied to the thermoplastic liquid crystal polymer film 5'. Also, the time for which the thermoplastic liquid crystal polymer film 5' contacts with the heat treatment roll 9 was 15 seconds. The obtained thermoplastic liquid crystal polymer film 5 after heat treatment, that is the film before the metal foil was laminated thereon, was sampled and measured to determine the thermal dimensional change. The result is given in Table 6 together with bond strength, dimensional stability and appearance of the obtained laminate 10.

EXAMPLE 2

The thermoplastic liquid crystal polymer film of B-type obtained in the Reference Example 2 and electrolytic copper foils having a thickness of 18 μm were used. The heat treatment roll 9 having a lot of unevenness 91 with a height of 15 μm at a rate of 10/10000 m² on its surface was attached to the continuous hot roll press apparatus shown in FIG. 1. A temperature of the heat treatment roll 9 was set to 200° C. and a temperature of the press rolls 6 and 7 was set to 260° C. The film of B-type and the electrolytic copper foils were thermally press-bonded by these rolls at a pressure of 10 Kg/cm², while being drawn at a rate of 2 m/min, to give a double-sided metal laminate 10 having a structure of metal foil/thermoplastic liquid crystal polymer film/metal foil. A tension of 3 Kg/40 cm width was applied to the thermoplastic liquid crystal polymer film 5'. Also, the time for which the thermoplastic liquid crystal polymer film 5' contacts with the heat treatment roll 9 was 15 seconds. The obtained thermoplastic liquid crystal polymer film 5 after heat treatment, that is the film before the metal foil was laminated thereon, was sampled and measured to determine a thermal dimensional change. The result is given in Table 6 together with bond strength, dimensional stability and appearance of the obtained laminate 10.

EXAMPLE 3

The thermoplastic liquid crystal polymer film of A-type obtained in the Reference Example 1 and electrolytic copper foils having a thickness of 18 μm were used. The heat treatment roll 9 having a lot of unevenness 91 with a height of 2 μm at a rate of 10/10000 μm² on its surface was attached to the continuous hot roll press apparatus shown in FIG. 1. A temperature of the heat treatment roll 9 was set to 200° C. and a temperature of the press rolls 6 and 7 was set to 260° C. The film of A-type and the electrolytic copper foils were thermally press-bonded by these rolls at a pressure of 10 Kg/cm², while being drawn at a rate of 2 m/min, to give the double-sided metal laminate 10 having a structure of metal foil/thermoplastic liquid crystal polymer film/metal foil. A tension of 3 Kg/40 cm width was applied to the thermoplastic liquid crystal polymer film 5'. Also, the time for which the thermoplastic liquid crystal polymer film 5' contacts with the heat treatment roll 9 was 15 seconds. The obtained thermoplastic liquid crystal polymer film 5 after heat treatment, that is the film before the metal foil was laminated thereon, was sampled and measured to determine a thermal dimensional change. The result is given in Table 6 together with bond strength, dimensional stability and appearance of the obtained laminate 10.

EXAMPLES 4 THROUGH 6

The procedures of Example 1 were repeated to give a double-sided metal laminate 10, except that the temperature of the heat treatment roll 9 was changed to 180° C. in Example 4, 220° C. in Example 5 and 140° C. in Example 6. Thermal dimensional change of the obtained thermoplastic liquid crystal polymer film 5 after heat treatment, that is the film before the metal foil was laminated thereon, are given in Table 6 together with bond strength, dimensional stability and appearance of the obtained laminate 10.

COMPARATIVE EXAMPLE 1

The thermoplastic liquid crystal polymer film of A-type obtained in the Reference Example 1 and electrolytic copper foils having a thickness of 18 μm were used. A heat treatment roll without the unevenness 91 on its surface was attached to the continuous hot roll press apparatus shown in FIG. 1. A temperature of the heat treatment roll was set to 200° C. and a temperature of the press rolls 6 and 7 was set to 260° C. The film of A-type and the electrolytic copper foils were thermally press-bonded by these rolls at a pressure of 10 Kg/cm², while being drawn at a rate of 2 m/min, to give the double-sided metal laminate having a structure of metal foil/thermoplastic liquid crystal polymer film/metal foil. A tension of 3 Kg/40 cm width was applied to the thermoplastic liquid crystal polymer film 5'. Also, the time for which the thermoplastic liquid crystal polymer film 5' contacts with the heat treatment roll 9 was 15 seconds. A thermal dimensional change of the obtained thermoplastic liquid crystal polymer film 5 after heat treatment, that is the film before the metal foil was laminated thereon, was given in Table 6 together with bond strength, dimensional stability and appearance of the obtained laminate 10.

COMPARATIVE EXAMPLE 2

The thermoplastic liquid crystal polymer film of B-type obtained in the Reference Example 2 and electrolytic copper foils having a thickness of 18 μm were used. A heat treatment roll without the unevenness 91 on its surface was attached to the continuous hot roll press apparatus shown in FIG. 1. A temperature of the heat treatment roll was set to 200° C. and a temperature of the press rolls 6 and 7 was set to 260° C. The film of B-type and the electrolytic copper foils were thermally press-bonded by the press rolls at a pressure of 10 Kg/cm², while being drawn at a rate of 2 m/min, to give the double-sided metal laminate 10 having a structure of metal foil/thermoplastic liquid crystal polymer film/metal foil. A tension of 3 Kg/40 cm width was applied to the thermoplastic liquid crystal polymer film 5'. Also, the time for which the thermoplastic liquid crystal polymer film 5' contacts with the heat treatment roll 9 was 15 seconds. A thermal dimensional change of the obtained thermoplastic liquid crystal polymer film 5 after heat treatment, that is the film before the metal foil was laminated thereon, was given in Table 6 together with bond strength, dimensional stability and appearance of the obtained laminate 10.

TABLE 6

| | Thermal dimensional change of film after treatment (%) | Bond strength heat (Kg/cm) | Dimensional stability of laminate (%) MD | Dimensional stability of laminate (%) TD | Appearance |
|---|---|---|---|---|---|
| Example 1 | 0.05 | 1.2 ± 0.1 | −0.01 | +0.01 | ○ |
| Example 2 | 0.07 | 1.3 ± 0.1 | +0.05 | −0.02 | ○ |
| Example 3 | 0.04 | 1.5 ± 0.1 | −0.02 | +0.01 | Δ |
| Example 4 | 0.10 | 1.2 ± 0.1 | 0 | +0.01 | ○ |
| Example 5 | −0.05 | 1.2 ± 0.1 | −0.03 | −0.05 | Δ |
| Example 6 | 0.35 | 1.2 ± 0.1 | +0.05 | +0.07 | Δ |
| Comparative Example 1 | 1.2 | 1.2 ± 0.5 | +0.10 | −0.05 | X |
| Comparative Example 2 | −2.0 | 0.7 ± 0.7 | +0.25 | −0.20 | X |

As is clear from the Table 6, as for the metal laminate obtained in the Comparative Example 1, its bonding strength is sufficient, but the thermal dimensional change of the film after heat treatment is not good, and the dimensional stability and appearance of the laminate are not good. Also, as for the metal laminate obtained in the Comparative Example 2, the thermal dimensional change of the film after heat treatment is not good, and the dimension stability and appearance of the laminate are not good. On the contrary, as for the metal laminates obtained in the Examples 1 through 6 of the present invention, their thermal dimensional change of the films after heat treatment were excellent, and all the bonding strength, dimension stability and appearance of the laminate are excellent.

Although the present invention has been fully described in connection with the preferable embodiments thereof with reference to the accompanying drawing which are used only for the purpose of illustration, those skilled in the art will readily conceive numerous changes and modifications within the framework of obviousness upon the reading of the specification herein presented of the present invention. Accordingly, such changes and modifications are, unless they depart from the scope of the present invention as delivered from the claims annexed hereto, to be construed as included therein.

This application is based on Japanese Patent Application No. 2001-63382, filed on Mar. 7, 2001, the entire contents of which are hereby incorporated by reference.

What is claimed is:

1. A method for continuously producing a metal laminate, the method comprising:
   heat-treating a film comprising a thermoplastic polymer, which is capable of forming an optically anisotropic melt phase, on a heat treatment roll having unevenness on a surface thereof without transferring the unevenness to the film; and,
   bonding a metal sheet to at least one side of the heat-treated film, wherein
   the film is heat-treated on the heat treatment roll having the unevenness on the surface thereof under substantially no pressure;
   a thermal dimensional change of said heat-treated film is not more than 0.1% at 200° C.; and
   a height of the unevenness provided on the surface of the heat treatment roll is within the range from 1 μm to 15 μm.

2. The method according to claim 1, wherein a temperature of the heat treatment roll is within the range from a temperature lower by 30° C. than a thermal deflection temperature of the film to the thermal deflection temperature.

3. The method according to claim 1, wherein the metal sheet is continuously bonded to at least one side of the film by thermal press-bonding.

4. The method according to claim 1, wherein the height of the unevenness does not exceed ⅔ of the thickness of the film comprising the thermoplastic polymer.

* * * * *